United States Patent [19]

Jahani

[11] 4,404,080
[45] Sep. 13, 1983

[54] MOLDED PLATING MASK
[75] Inventor: Hooshang Jahani, San Jose, Calif.
[73] Assignee: National Semiconductor Corporation, Santa Clara, Calif.
[21] Appl. No.: 360,742
[22] Filed: Mar. 22, 1982
[51] Int. Cl.³ ............................................ C25D 17/00
[52] U.S. Cl. .................................. 204/224 R; 204/15; 204/279; 264/255
[58] Field of Search .................... 204/15, 224, 279; 106/38.2; 264/255

[56] References Cited
U.S. PATENT DOCUMENTS 1,472,516  10/1923  Dula ..................................... 264/255
2,445,290   7/1948  Gonda .................................. 264/255
3,240,685   3/1966  Maissel ................................ 204/224
4,294,681  10/1981  Lincoln et al. ....................... 204/15

Primary Examiner—T. Tung
Assistant Examiner—Nathan S. Thane
Attorney, Agent, or Firm—Paul J. Winters; Michael J. Pollock; Gail W. Woodward

[57] ABSTRACT

A plating mask of molded unitary configuration with electrolyte admitting openings held to very accurate position and dimension by a molding process in which the mask is formed between two separable molds with forms supported therebetween to exclude material from both mask penetrating and transverse circulation passageways.

4 Claims, 8 Drawing Figures

U.S. Patent    Sep. 13, 1983    Sheet 1 of 2    4,404,080
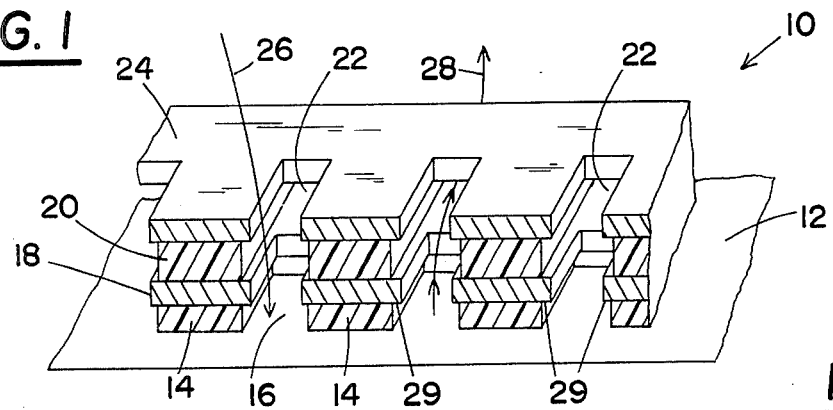
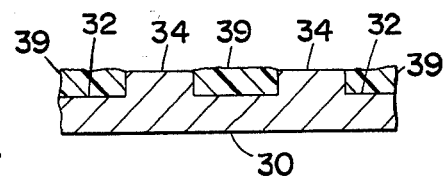
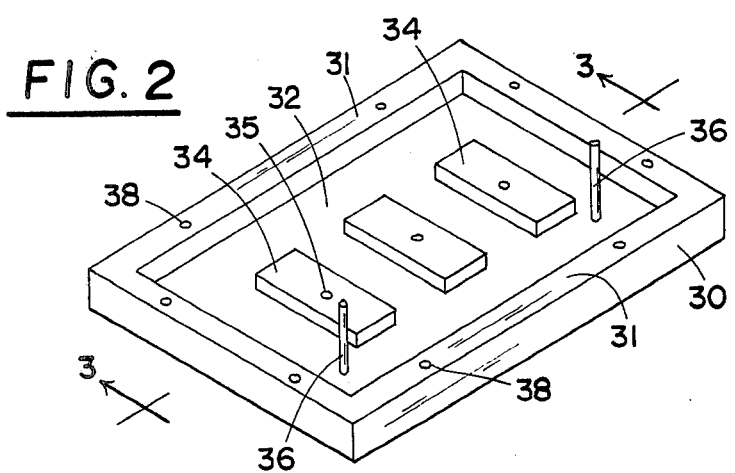
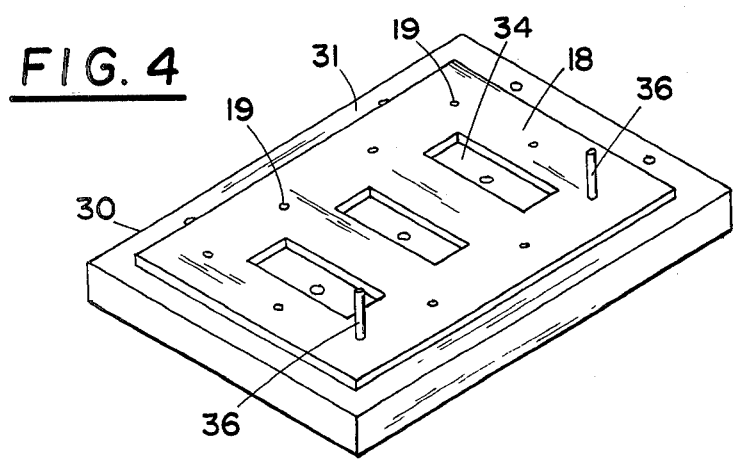

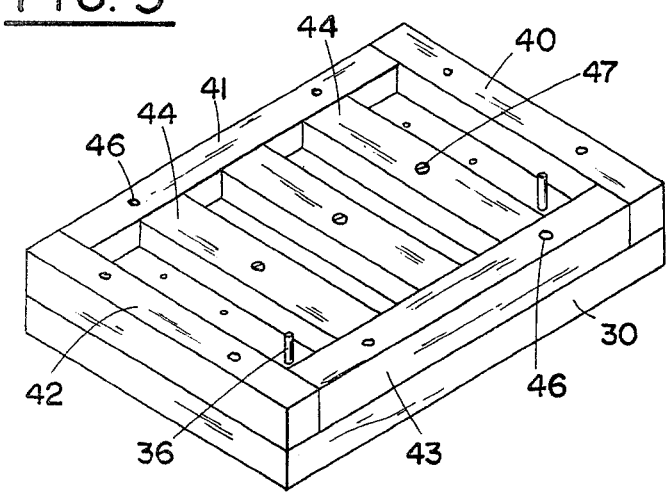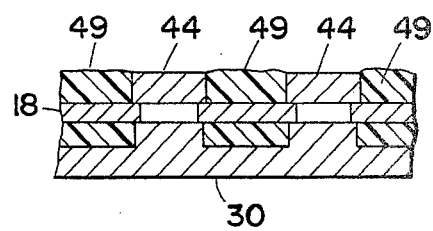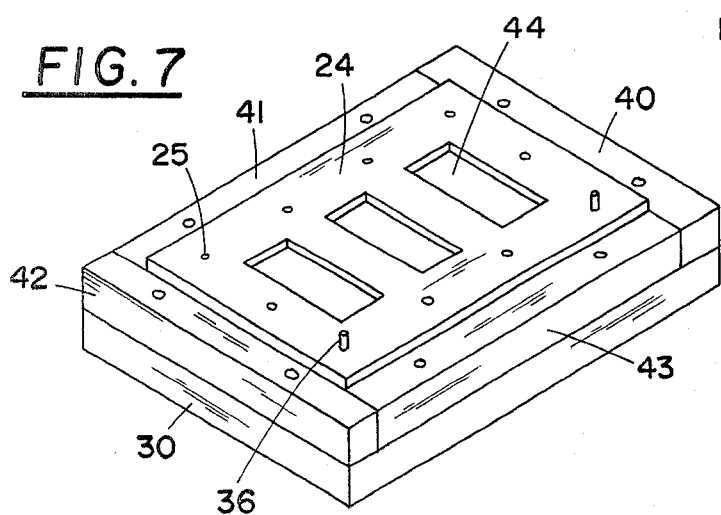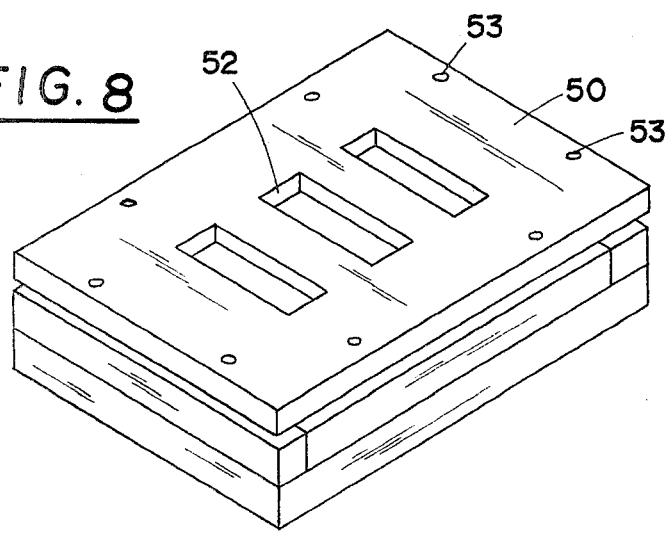

MOLDED PLATING MASK

BACKGROUND OF THE INVENTION

Plating selected areas of a metal web is effectively accomplished by compressing the metal web between resilient sealing masks with apertures in the mask designed to allow electrolyte to reach only the selected areas. Such apparatus is typified by U.S. Pat. No. 3,723,283 and especially sealing gasket 82 of FIG. 6 therein.

When precious metals are being plated, it is desirable to have very accurately located and sized apertures in these masks so that the apertures may be made smaller, plating less metal, while still retaining confidence that everything that needs to be plated, does indeed get plated. Prior art masks have thus been carefully hand assembled which is slow, tedious, expensive, and still not all that accurate. My invention overcomes these problems.

SUMMARY OF THE INVENTION

Briefly, the present invention contemplates producing a plating mask, complete with all its apertures and complex three-dimensional electrolyte passageways, with a single molding approach. The resulting mask is more accurate dimensionally, stronger and more durable, and, as a consequence of the process, capable of subtleties of shape and design hertofore unobtainable with hand assembly. To accomplish a single molding step, a process and mold have been invented that guarantee proper position and shape for the all important apertures.

BRIEF DESCRIPTION OF THE DRAWINGS

FIG. 1 is a section, of a fragmentary portion, of a typical mask that may be produced from the process of this invention, showing the new structural features obtainable.

FIGS. 2-8 show consecutive steps in the assembly of the mold and the process to create the mask of the invention.

DESCRIPTION OF THE PREFERRED EMBODIMENT

In FIG. 1, a portion of a typical plating mask 10 is shown in sealing facing contact with a web of metal 12 that is to be plated in selected areas, such as area 16. A sealing face 14, comprising an apertured layer of a resilient material such as silicone rubber, covers all areas of web 12 that are not to be plated. It is useful to make mask 10 springably compressible so as to absorb dimensional inaccuracies and conform snugly to web 12. However, excessive distortion of face 14 changes the size of the apertures and, thus, the size of selected area 16. Hence, resiliency is created by a backing structure made up from a planar fiberglass rigidizing member 18, rubber spacers 20, and a backing plate 24. Apertures in member 18 and plate 24 correspond in location to the apertures in face 14 so as to create supply passageways for the plating electrolyte to pass through the backing structure, to selected areas 16, as shown by an arrow 26. Additional transverse passageways 22 intersect the first passageways to further promote good electrolyte circulation. The plating electrolyte solution may easily escape through passageways 22 following the path shown by arrow 28.

Another way to preserve the shape of the apertures in face 14 during compression against web 12, in addition to the resilient backing structure, is to provide good mechanical support at the edges of the rubber face layer 14. In the past, to insure accurate alignment of the holes in member 18 with the holes in face 14, it was necessary to glue together continuous layers of rubber and fiberglass and then cut holes through both at one time. The edges of the apertures in layer 14 would thus be even with the edges of the rigidizing support member 18. In this configuration, the rubber material easily curls over the edge of support member 18 and distorts the size of the aperture. This problem is avoidable with the highly accurate process of the present invention by creating a ledge 29, about 0.01 inches wide, as shown, about the edges of the aperture so that good mechanical support for facing layer 14 is guaranteed.

Creating the new mask of FIG. 1 requires a new and novel process as well which is disclosed in FIGS. 2-8. FIG. 2 shows a front mold 30 for a three aperture mask. In the real world, masks would typically have many more apertures, perhaps forty, and a more complex shape, but I show a very small idealized shape herein for ease of description. A raised rim 31 encloses a smooth face forming surface 32.

Three aperture creating forms 34 are supported on surface 32 in the correct position to exclude resilient material from the selected areas. Threaded holes 35 in forms 34 and holes 38 in rim 31 provide fastening points for later added parts of the mold. A pair of alignment studs 36 insure correct positioning of later added parts.

A liquid silicone rubber molding material 39, or its equivalent, is poured onto surface 32, around forms 34, and within rim 31, to a depth at or just above forms 34 as shown in the sectional view of FIG. 3, taken on line 3—3 in FIG. 2. Then the planar rigidizing member 18 is slid down over studs 36, as shown in FIG. 4, and brought to rest on top of forms 34. The apertures in member 18 are slightly smaller than forms 34 so that member 18 rests on forms 34 and overlap enough to create ledge 29, as discussed with respect to FIG. 1.

FIG. 5 shows the next step wherein spacers 40, 41, 42 and 43 are located about the perimeter of member 18, on rim 31, and insert forms 44 are placed over the apertures in member 18. Inserts 44 exclude molding material from transverse passageways 22 and are mounted with screws 47 to holes 35. Holes 46 in spacers 40-43 provide access to threaded holes 38. Additional molding material 49 is poured on member 18 as shown in FIG. 6. It should be noted that member 18 may include holes 19 to achieve a good mechanical connection between the rubber 39 and the rubber 49, and with member 18.

In FIG. 7, backing plate 24, which may also have holes 25, is slid over studs 36, onto inserts 44 and rubber material 49. Finally, in FIG. 8, a clamping plate 50 is mounted on top with screws 53 secured in threaded holes 38. If desired relief openings 52 may be desired to permit the escape of excess molding material.

After the rubber is cured, the various parts of the mold can be readily disassembled and inserts 44 extracted from the passageways 22. The structure of mask 10 results with a high degree of dimensional accuracy due to the reliable dimensions of the mold parts.

I claim:

1. A plating mask having a first resilient layer forming a sealing face for facing contact with a surface to be plated, a backing structure supporting said sealing face, said backing structure comprising first and second planar rigidizing support members with a second resilient layer therebetween, first electrolyte fluid passageways extending through said first and second planar support members and said second resilient layer and said sealing face, to selected areas of said surface, second electrolyte passageways in said second resilient layer generally transverse to, and in communication with, said first passageways, said plating mask formed by the process of molding a resilient material between front and back molds held apart by removable spacers, said front and back molds containing therebetween first and second forms to exclude said resilient material from the passageways, the first forms creating said first passageways and being mounted on said front mold and the second forms creating said passageways and being held in place by being fastened in the first forms, said second planar support member being disposed between said first and second forms.

2. The mask of claim 1 in which said removable spacers are disposed between said front and back molds and about the perimeter of said front and back molds so as to enclose the space between the molds and contain said resilient material therein.

3. A plating mask having a sealing face for facing contact with a surface to be plated, a backing structure supporting said sealing face, first electrolyte fluid passageways extending from and through said backing structure, through said sealing face, to selected areas of said surface, second electrolyte passageways inside said backing structure generally transverse to, and in communication with, said first passageways, said plating mask including a rigidizing planar member parallel to and behind said sealing face with apertures therein corresponding in location to said first passageways, the edges of said apertures extending inwards toward the first passageways farther than the edges of the corresponding opening in the sealing face so as to help prevent said sealing face from curling over the edge of the planar member and into said first passageway.

4. The process of forming a plating mask having a sealing face for facing contact with a surface to be plated, a backing structure supporting said sealing face, first electrolyte fluid passageways extending from and through said backing structure, through said sealing face, to selected areas of said surface, second electrolyte passageways inside said backing structure generally transverse to, and in communication with, said first passageways, comprising the steps of molding material on a mold to form said sealing face, placing a rigidizing member thereon, placing spacers about the perimeter of the mold to contain said material, placing inserts on said rigidizing member to exclude molding material from the passageways, adding more molding material, adding an additional rigidizing member to the assembled components, and curing the molding material into a resilient integrated structurally supporting continuous medium throughout said plating mask.

* * * * *